(12) United States Patent
Modica et al.

(10) Patent No.: US 7,772,926 B2
(45) Date of Patent: Aug. 10, 2010

(54) SETTING THE DC OPERATING CURRENT OF A RAIL-TO-RAIL OUTPUT STAGE OF AN OP-AMP

(75) Inventors: Eric Modica, San Jose, CA (US); Derek Bowers, Los Altos Hills, CA (US)

(73) Assignee: Analog Devices, Inc., Norwood, MA (US)

( * ) Notice: Subject to any disclaimer, the term of this patent is extended or adjusted under 35 U.S.C. 154(b) by 172 days.

(21) Appl. No.: 12/198,016

(22) Filed: Aug. 25, 2008

(65) Prior Publication Data

US 2010/0044835 A1    Feb. 25, 2010

(51) Int. Cl.
*H03F 3/26* (2006.01)
(52) U.S. Cl. .................. 330/267; 330/288; 330/296
(58) Field of Classification Search .......... 330/267, 330/288, 296
See application file for complete search history.

(56) References Cited

U.S. PATENT DOCUMENTS

| | | | |
|---|---|---|---|
| 3,852,679 A * | 12/1974 | Schade, Jr. ............... 330/257 |
| 4,329,639 A | 5/1982 | Davis | |
| 4,901,030 A * | 2/1990 | Webster ................... 330/252 |
| 5,416,365 A * | 5/1995 | Maida ..................... 327/111 |
| 5,841,603 A * | 11/1998 | Ramalho et al. ............. 360/68 |
| 5,889,433 A | 3/1999 | Honma | |
| 6,229,394 B1 | 5/2001 | Harvey | |
| 6,486,739 B1 | 11/2002 | Luo | |
| 6,784,739 B2 * | 8/2004 | Reffay et al. .............. 330/264 |
| 6,803,822 B2 * | 10/2004 | Kim et al. ................ 330/296 |

* cited by examiner

*Primary Examiner*—Patricia Nguyen
(74) *Attorney, Agent, or Firm*—Kenyon & Kenyon LLP

(57) ABSTRACT

In an output stage of an operational amplifier, first and second transistors each provide a collector current under quiescent conditions to first and second current sources. A resistor receives a portion of one the collector currents and produces a resistor voltage in response. An output transistor provides a quiescent current having a value calculated as a function of the resistor voltage and a base-emitter voltage of the second transistor.

22 Claims, 4 Drawing Sheets

US 7,772,926 B2

SETTING THE DC OPERATING CURRENT OF A RAIL-TO-RAIL OUTPUT STAGE OF AN OP-AMP

BACKGROUND

1. Field of the Invention

Aspects of the present invention relate generally to an operational amplifier, and more particularly to setting the quiescent current in a rail-to-rail output stage of an operational amplifier.

2. Description of Related Art

Operational amplifiers ("op-amps") are widely known and used electronic devices that may be employed in a variety of applications. Generally, an op-amp is a DC-coupled high gain electronic voltage amplifier with differential inputs and a single output. As op-amps trend toward using lower supply voltages, the ability for the op-amp to swing from rail to rail has increased in importance. By being able to swing from rail to rail, the op-amp may use its full or close to its full voltage range on output and input. Rail-to-rail op-amps may be suited for low voltage applications.

However, random variations in the quiescent current flowing in the op-amp may occur due to manufacturing processes. These variations may affect the ability to properly bias an output transistor to control and maintain the desired quiescent current in a circuit.

Therefore, it may be desirable to provide a circuit arrangement that precisely sets the quiescent current in a rail-to-rail output stage of the op-amp.

SUMMARY

Embodiments of the present invention overcome the above-mentioned and various other shortcomings of conventional technology, providing an output stage of an op-amp having first and second transistors that each may provide a collector current under quiescent conditions to first and second current sources. A resistor may receive a portion of one of the collector currents and produce a resistor voltage in response. An output transistor may provide a quiescent current having a value calculated as a function of the resistor voltage and a base-emitter voltage of the second transistor.

The foregoing and other aspects of various embodiments of the present invention will be apparent through examination of the following detailed description thereof in conjunction with the accompanying drawing figures.

BRIEF DESCRIPTION OF THE DRAWING FIGURES

DETAILED DESCRIPTION

It will be appreciated from the following description that the embodiments set forth herein may have utility in connection with op-amps having various applications, including but not limited to industrial process control, battery-powered instrumentation, power supply control and protection, telecommunications, remote sensing, low voltage strain gage amplifiers, and DAC output amplifiers.

Figure 1:
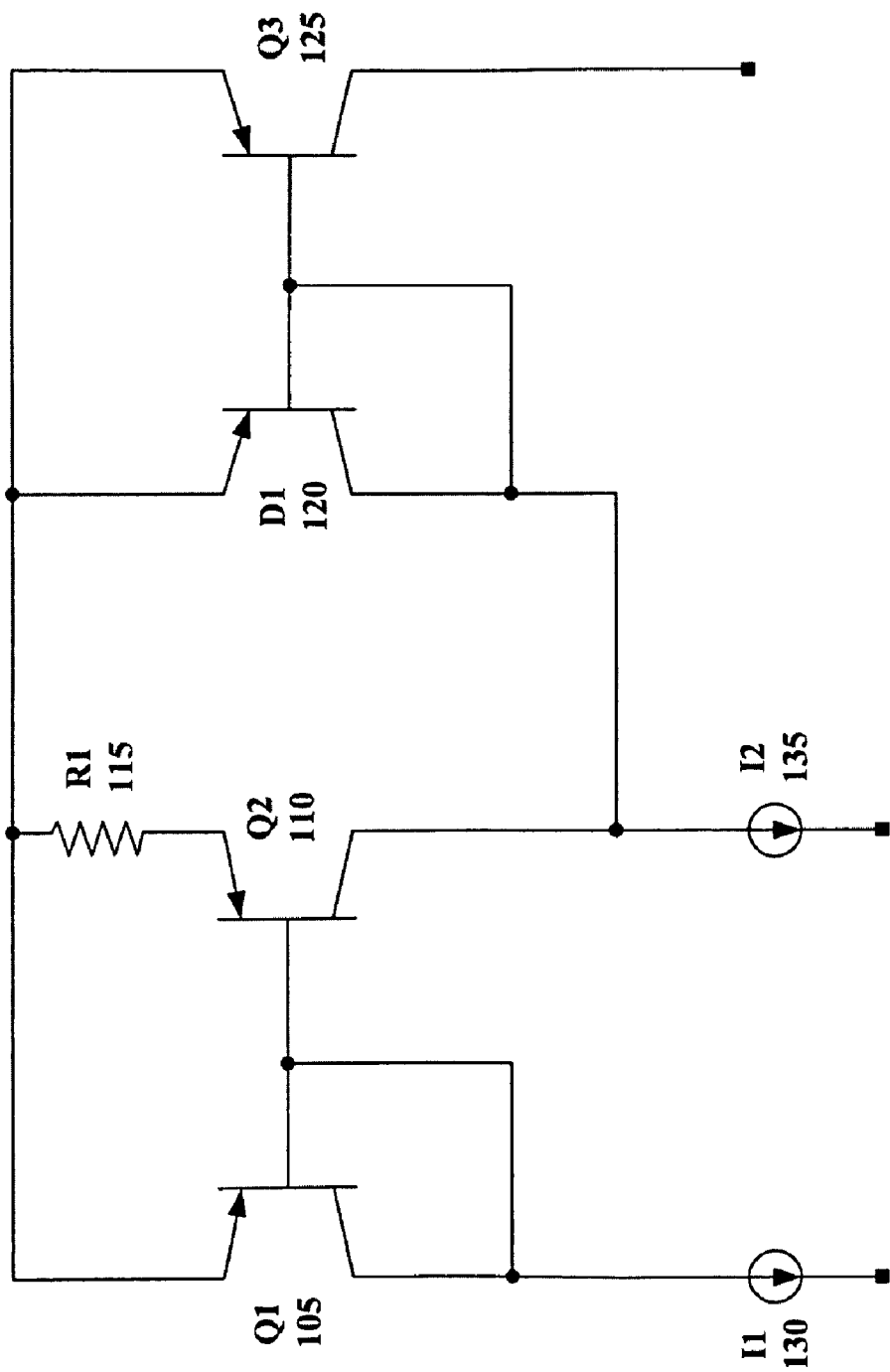
FIG. 1 is a schematic diagram of an embodiment of a portion of an output stage of an op-amp.

By way of illustration, FIG. 1 is a schematic diagram of an embodiment of a portion of an output stage of an op-amp. Transistors Q1 105 and Q2 110 may be bipolar PNP transistors. Transistors Q1 105 and Q2 110 may be identical or matching transistors. The transistors Q1 105 and Q2 110 may be connected together at their respective bases. An emitter of Q1 105 may be connected to a supply voltage rail, while a collector is connected to a current source I1 130. An emitter of transistor Q2 110 may be connected in series to one end of resistor R1 115 with the other end of resistor R1 115 connected to the supply voltage rail. A collector of transistor Q2 110 may be connected to a current source I2 135. Resistor R1 115 may have its value set such that in quiescent conditions (i.e., with no input signal applied) resistor R1 115 degenerates the base-emitter voltage $V_{BE}$ of transistor Q2 110 through the voltage drop across resistor 115. In one embodiment, resistor R1 115 may have a value of 200Ω. As a result of the voltage drop across resistor 115, the base-emitter voltage $V_{BE}$ of Q2 110 may be smaller than the base-emitter voltage $V_{BE}$ of Q1 105, and correspondingly, the collector current $I_{CQ2}$ of transistor Q2 110 may be smaller than the collector current $I_{CQ1}$ of transistor Q1 105. Because collector current $I_{CQ2}$ of Q2 110 is smaller than collector current $I_{CQ1}$ of Q1 105, a difference in collector currents, $dI_C$, may exist between the two transistors Q1 105 and Q2 110 (i.e., $I_{CQ1} - I_{CQ2} = dI_C$).

In one embodiment, current sources I1 130 and I2 135 may demand equal amounts of current from transistors Q1 105 and Q2 110. For example, current sources I1 130 and I2 135 may ask for 12 μA from transistors Q1 105 and Q2 110. Because Q2's 110 collector current $I_{CQ2}$ is less than Q1's 105 collector current $I_{CQ1}$, current source I2 135 may obtain the difference in current $dI_C$ from diode D1 120. In the embodiment where current sources I1 130 and I2 135 are demanding 12 μA from transistors Q1 105 and Q2 110, 12 μA of current may be provided by the collector of transistor Q1 105, while only 11 μA of current may flow from the collector of transistor Q2 110. Diode D1 120 may supply approximately 1 μA if base current errors from transistor Q3 125 are ignored. Diode D1 120 may mirror current $dI_C$ to output stage transistor Q3 125, with transistor Q3 125 having an 80:1 ratio relative to diode D1. Output stage transistor Q3 may be a bipolar PNP transistor. The difference current $dI_C$ mirrored by the diode to transistor Q3 125 and amplified by transistor Q3 125 sets the value of quiescent current $I_{CQ3}$ in transistor Q3 125. Using the exemplary figures recited herein in the discussion of FIG. 1, the quiescent current may be approximately 80 μA if the current $dI_C$ supplied by the diode D1 120 is approximately 1 μA.

In the foregoing embodiment of FIG. 1, the quiescent current $I_{CQ3}$ may be determined and set as a function of the value of degeneration resistor R1 115. To adjust the quiescent current $I_{CQ3}$, the value of the degeneration resistor R1 115 may be changed. A drawback of using the degeneration resistor R1 115 to set the quiescent current $I_{CQ3}$ of transistor Q3 125 is that the emitters of transistors Q1 105 and Q2 110 must perfectly match. For instance, if resistor R1 has a value of 200Ω and current sources I1 130 and I2 135 both demand 12 uA, a 2.4 mV drop is formed on R1. Assuming no base current error and a perfect match between the emitters of Q1 105 and Q2 110, Q1's collector current $I_C$ would be about 10% larger than Q2's collector current $I_C$. If process variation was bad enough to render Q1's 105 emitter 10% smaller than Q2's 110 emitter then, in effect, there would be no difference between Q1's collector current $I_C$ and Q2's collector current $I_C$ (i.e., $dI_C \approx 0$).

Figure 2:
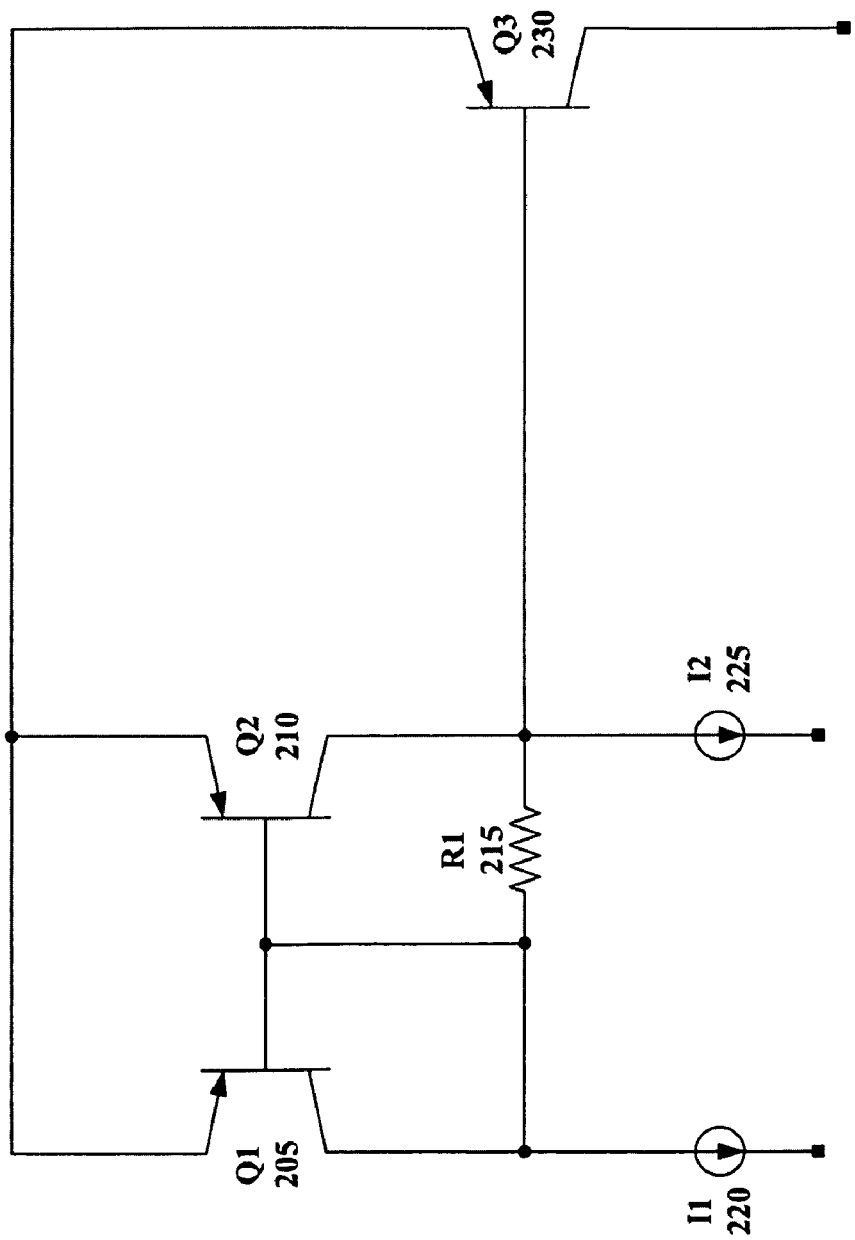
FIG. 2 is a schematic diagram of an embodiment of a portion of an output stage of an op-amp.

FIG. 2 is a schematic diagram of an embodiment of a portion of an output stage of an op-amp. As shown in FIG. 2, transistors Q1 205 and Q2 210 may be PNP bipolar transistors. However, in accordance with the principles of the invention, these transistors are not so limited. The emitters of both transistors Q1 205 and Q2 210 may be connected to the same rail. The bases of the respective transistors may be connected together. The areas of the emitters of respective transistors Q1 205 and Q2 210 may be mismatched, such that the emitter for one transistor has a larger area relative to the emitter for the other transistor. In one embodiment, the ratio of the areas of the emitters of Q1 205 and Q2 210 may be 5:6, but other ratios may be used as long as a difference in the base-emitter voltages of the two transistors exists. In one embodiment, this base-emitter voltage difference may be at least 1 mV.

A resistor R1 215 may be connected at one end to the bases of the transistors Q1 205 and Q2 210 and the collector of Q1 205, and at the other end to the collector of transistor Q2. In one embodiment, resistor R1 215 may have a value of 20 kΩ. The collector of transistor Q2 210 and resistor R1 215 may be connected to the base of transistor Q3 230 and to current source I2 225. The collector of transistor Q1 205 may be connected to current source I1 220. In one embodiment, current sources I1 220 and I2 225 may demand and supply equal amounts of current I. In one embodiment, the current I demanded by current sources I1 220 and I2 225 may be 12 µA. If the emitter of transistor Q1 205 is ⅚th the size of the emitter of transistor Q2 210, collector current $I_{CQ1}$ of Q1 205 will be approximately ⅚th of collector current $I_{CQ2}$ of Q2 210. The difference in current, $dI_C$, between $I_{CQ1}$ and $I_{CQ2}$ (i.e., ⅙th of I) may be split between the two current sources I1 220 and I2 225 since the two current sources I1 220 and I2 225 are demanding equal amounts of current I from transistors Q1 205 and Q2 210. Half of this current difference, $dI_C$, that is 1 µA or 1/12 of the current I for the embodiment where I=12 µA, flowing from Q2 210 to current source I1 220 may flow through resistor R1 215, setting up a voltage drop $dV_{BE}$ ($dV_{BE}=dI_C*R1$) across resistor R1 215. The base-emitter voltage of transistor Q3 230 may be expressed as $V_{BEQ3} \approx V_{BEQ1} - dV_{BE}$, where $dV_{BE} = 1/12*I*R1$.

A quiescent current $I_{CQ3}$ of transistor Q3 230 may have a value calculated as a function of the base-emitter voltage $V_{BEQ3}$ of transistor Q3 230, with the value of the quiescent current in transistor Q3 230 determined using the equations:

$$V_{BEQ3} = V_{BEQ1} - 1/12*I*R1 \quad (1)$$

$$V_T \ln(I_{CQ3}/80) = V_T \ln(I_{CQ1}/5) - 1/12*I*R1 \quad (2)$$

$$V_T \ln(I_{CQ3}/(16*I_{CQ1})) = -1/12*I*R1 \quad (3)$$

$$I_{CQ3} = e^{((-1/12*I*R1)/26\,mv)} * 16*I_{CQ1} \quad (4)$$

In the equations above, the value 16 used in equation (3) may represent the ratio between transistor Q3 230 and transistor Q1 205. $V_T$ is the thermal voltage determined by the equation $V_T = kT/q$, with k being Boltzmann's constant, T being the absolute temperature in Kelvins, and q being the magnitude of the electrical charge on the electron (in coulombs). $V_T$ is approximately 26 mV. The base-emitter voltage $V_{BEQ1}$ of transistor Q1 205 may vary logarithmically with any variation in the current source I1 220. The voltage drop $dV_{BE}$ across resistor R1 215 may vary little because of the proximity and like diffusions of transistors Q1 205 and Q2 210.

Compared to the embodiment of FIG. 1 which relies on the absolute precision of the value of the degeneration resistor R1 115 to set and control the quiescent current $I_{CQ3}$ of transistor Q3 125, the circuit of FIG. 2 may raise or lower the quiescent current $I_{CQ3}$ of transistor Q3 230 by changing the ratio of the emitter areas of transistors Q1 205 and Q2 210. A larger difference in the ratio of emitter areas of transistors Q1 205 and Q2 210 may decrease the quiescent current flowing in transistor Q3 230, while a smaller difference in the ratio of the emitter areas of transistors Q1 205 and Q2 210 may increase the quiescent current. The embodiment of FIG. 2 may further eliminate the need for the diode D1 120 found in the embodiment of FIG. 1 that mirrors the quiescent current to transistor Q3. The circuit of FIG. 2 is inherently more stable than the embodiment of FIG. 1, with the risk of shutting off output stage transistor Q3 235 greatly reduced, if not eliminated.

In an alternative embodiment, instead of mismatching the area of the emitters of transistors Q1 205 and Q2 210, the circuit embodied in FIG. 2 may have matching transistors Q1 205 and Q2 210. The current sources I1 220 and I2 225 may demand different amounts of current from transistors Q1 205 and Q2 210. For example, current source I1 220 may demand 13 µA and current source I2 225 may demand 11 µA. Because current source I1 220 demands more current than current source I2 225, a portion of current supplied by transistor Q2 210 may be redirected to feed current source I1 220, with the redirected portion of current routing through resistor R1 215, which in one embodiment may have a value of 20 kΩ. The resulting voltage drop, $dV_{BE}$, across resistor R1 215 may be used in conjunction with the base-emitter voltage $V_{BE}$ of transistor Q1 210 in calculating the base-emitter voltage $V_{BEQ3}$ of transistor Q3 230. The base-emitter voltage $V_{BEQ3}$ may be approximated as $V_{BEQ1} - dV_{BE}$. The quiescent current $I_{CQ3}$ of transistor Q3 230 may be set and calculated as a function of the base-emitter voltage $V_{BEQ3}$ of transistor Q3 230 using the equations described above.

Figure 3:
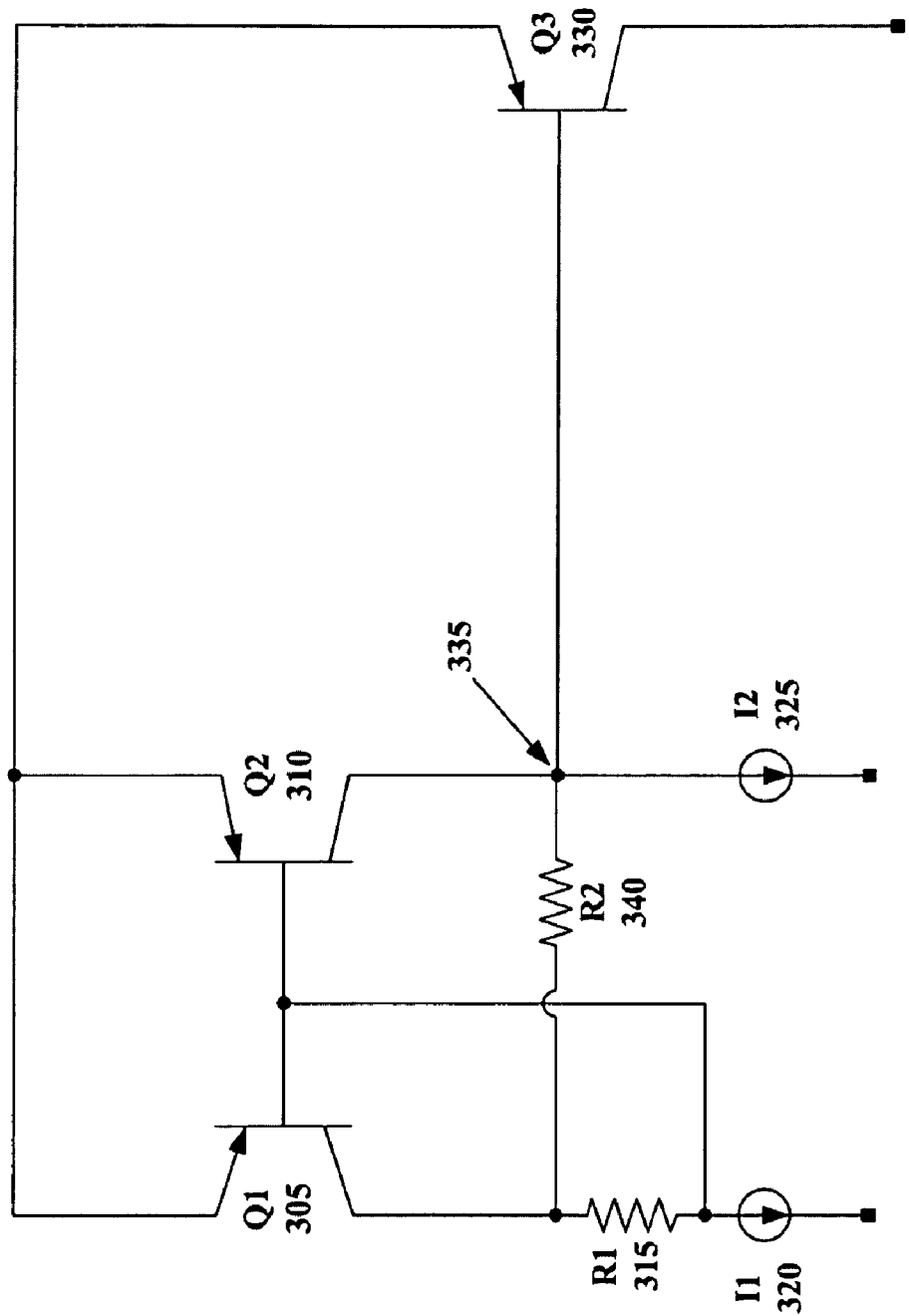
FIG. 3 is a schematic diagram of an embodiment of a portion of an output stage of an op-amp.

FIG. 3 is a schematic diagram of an embodiment of a portion of an output stage of an op-amp. In FIG. 3, transistors Q1 305 and Q2 310 may be bipolar PNP transistors. However, in accordance with the principles of the invention, these transistors are not so limited. Transistors Q1 305 and Q2 310 may be mismatched in the area of their respective emitters. In one embodiment, the ratio of emitter areas for Q1 305 relative to Q2 310 may be 5:6. The emitters of transistors Q1 305 and Q2 310 may be connected to the same rail. The bases of transistors Q1 305 and Q2 310 may be connected together. The collector of transistor Q1 305 may be connected to one end of resistor R1 315, with the other end of resistor R1 connected to current sources I1 320. A second resistor R2 340 may be connected at one end to resistor R1 315 and the collector of Q1 305, and at the other end to node 335, the collector of Q2 310, the base of Q3 330, and current source I2 325. Resistor R1 315 may have a value smaller than resistor R2 340 of the embodiment of FIG. 2. In one embodiment, resistor R1 315 may have a value of 200Ω, and resistor R2 340 may have a value of 20 kΩ.

Current sources I1 320 and I2 325 may demand the same amount of current I from transistors Q1 305 and Q2 310. Because transistors Q1 305 and Q2 310 are mismatched, Q1 305 and Q2 310 may provide different amounts of collector current. For the embodiment where the ratio of emitter areas for Q1 305 and Q2 310 is 5:6, 1/12 of current I may flow from the collector of Q2 310 through resistor R2 340. A voltage drop equal to 1/12*I*R2 may be produced across resistor R2 340.

As collector current flows from Q1 305, it will pass resistor R1 315, leading to the production of a second resistor voltage, or voltage drop, across resistor R1 315 equal to I*R1. Using the circuit of FIG. 3, the base-emitter voltage $V_{BEQ3}$ of transistor Q3 330 may be approximately calculated as $V_{BEQ3} \approx V_{BEQ1} - I*R2 - 1/12*I*R1$. The quiescent current $I_{CQ3}$ of transistor Q3 may be set and calculated as a function of the base-emitter voltage $V_{BEQ3}$ of transistor Q3 using the equation described below:

$$I_{CQ3}=e^{((-I*R2-1/12*I*R1)/26\,mV)}*16*I_{CQ1}$$

For the embodiment where I=12 µA, R1=200Ω, and R2=20 kΩ, the quiescent current $I_{CQ3}$ of transistor Q3 330 may be 81 µA. The value 16 in the equation above may reflect the ratio between transistor Q3 330 and transistor Q1 305. The embodiment of FIG. 3 is capable of biasing and steering the quiescent current $I_{CQ3}$ Of transistor Q3 330 by changing the value of resistor R1 315 or R2 340.

Figure 4:
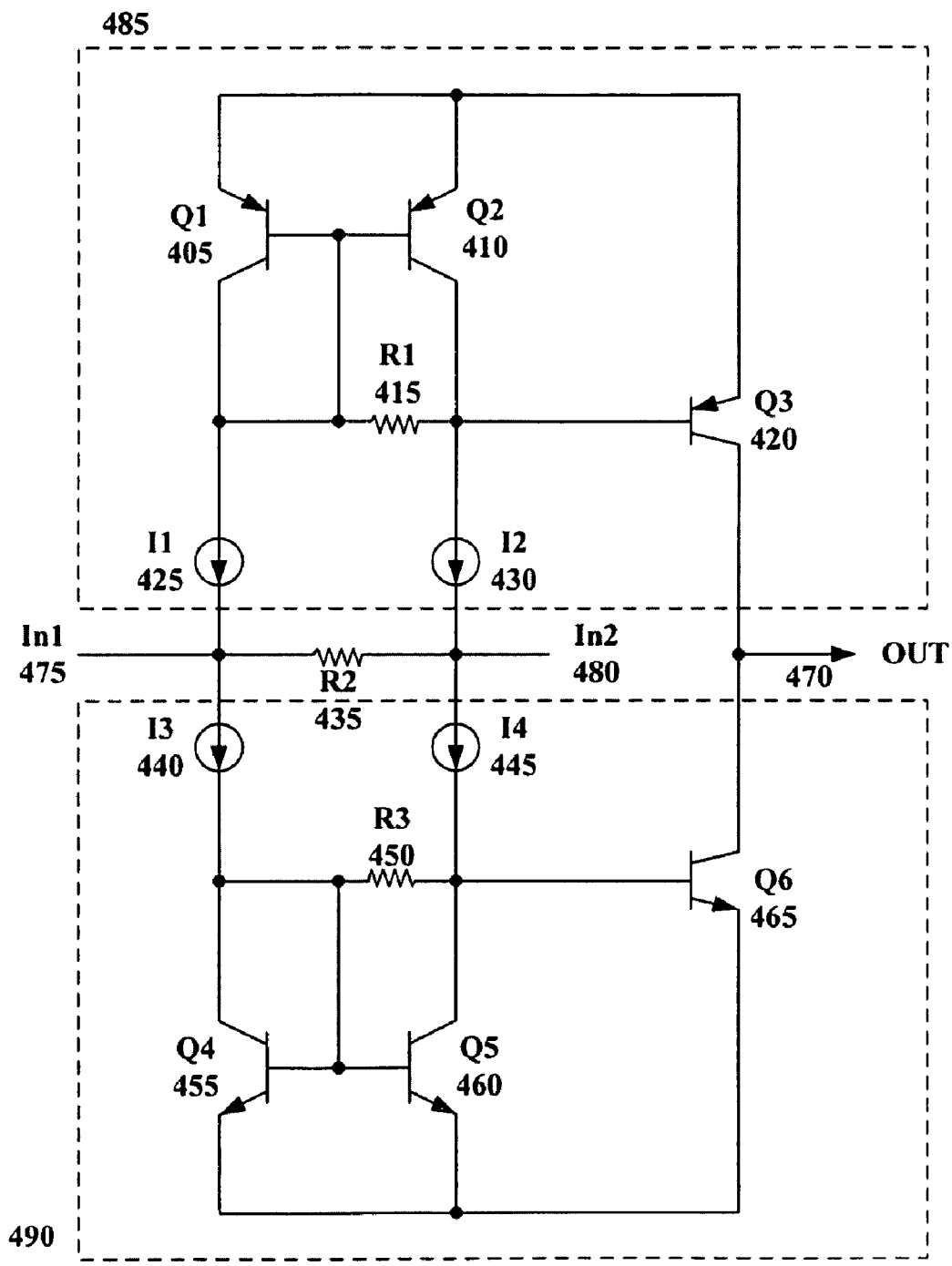
FIG. 4 is a schematic diagram of an embodiment of an output stage of an op-amp.

FIG. 4 is a schematic diagram of an embodiment of an output stage of an op-amp. FIG. 4 may include the circuit embodiment of FIG. 2 at the high side 485, and a symmetrical circuit embodiment employing NPN transistors on the low side 490. The symmetrical nature of the high side circuit 485 and the low side circuit 490 may produce a balanced op-amp, where $I_{CQ3}=I_{CQ6}$. The low side 490 may operate similarly to the embodiment of FIG. 2. For this embodiment, if transistor Q4 455 has an emitter with an area ⅚th of the emitter of transistor Q5 460, and if current sources I3 440 and I4 445 demand equal amounts of current, then the base-emitter voltage for transistor Q6 465 may be expressed as $V_{BEQ6}=V_{BEQ5}-1/12*I*R3$, with I being the amount of current demanded by current sources I3 440 and I4 445.

Certain embodiments disclosed herein describes a portion of an output stage of an op-amp. Any of these embodiments may be part of or connected at the various connection points shown in FIGS. 1 through 3 to a known op-amp, H-bridge, or other circuit. The embodiments disclosed herein are not intended to be limited in use with any particular op-amp or other circuit.

Several features and aspects of the present invention have been illustrated and described in detail with reference to particular embodiments by way of example only, and not by way of limitation. Those of skill in the art will appreciate that alternative implementations and various modifications to the disclosed embodiments are within the scope and contemplation of the present disclosure. For example, the foregoing embodiments have been described using transistors of a particular type (e.g. n-type, p-type). It will be apparent that inputs and transistor types can be varied to as to vary the circuit configuration, while providing the same effect. Also, for example, the foregoing embodiments have been described with respect to bipolar transistors. It will be apparent that other transistors may be used instead, while providing the same effect. For instance, the present invention may be applicable to MOS transistors, with a gate of a MOS transistor corresponding to the base of a bipolar transistor, the drain of a MOS transistor corresponding to the collector of a bipolar transistor, and the source of a MOS transistor corresponding to the emitter of a bipolar transistor. Use of MOS transistors in place of bipolar transistors may eliminate any base current errors associated with bipolar transistors. Therefore, it is intended that the invention be considered as limited only by the scope of the appended claims.

What is claimed is:

1. A circuit, comprising:
   first and second bipolar transistors having respective bases, collectors and emitters, with the bases of said first and said second bipolar transistors connected together and the emitters of said first and said second bipolar transistors connected to a supply voltage rail;
   a resistor connected to one of the collectors of said first and said second bipolar transistors and the collectors and bases of said first and said second bipolar transistors; and
   an output bipolar transistor having a base, collector, and emitter, the collector of said output bipolar transistor providing a quiescent current as a function of a base-emitter voltage of said first bipolar transistor and a voltage drop across said resistor.

2. The circuit of claim 1, further comprising first and second current sources to demand current from said first and second bipolar transistors.

3. The circuit of claim 2, further comprising a second resistor connected to the collector of said first bipolar transistor, the bases of said first and said second bipolar transistors, and the first current source.

4. The circuit of claim 2, wherein said first current source is connected to the collector of said first bipolar transistor, the bases of said first and said second bipolar transistors, and said resistor, and said second current source is connected to the collector of said second bipolar transistor, the base of said output bipolar transistor, and said resistor.

5. The circuit of claim 1, wherein said first bipolar transistor, said second bipolar transistor, and said output bipolar transistor are one of PNP bipolar transistors and NPN bipolar transistors.

6. The circuit of claim 1, wherein the emitters of said first and said second bipolar transistors are of different areas.

7. The circuit of claim 6, wherein the emitter area of said second bipolar transistor is larger than the emitter area of said first bipolar transistor.

8. The circuit of claim 2, wherein said first and said second current sources demand a same amount of current from said first and said second bipolar transistors.

9. The circuit of claim 2, wherein said first and said second current sources demand different amounts of current from said first and said second bipolar transistors.

10. The circuit of claim 1, wherein the quiescent current of said output transistor is calculated as a function of the difference of the base-emitter voltage of said second transistor and the voltage drop of said resistor.

11. A circuit, comprising:
    first and second bipolar transistors to each provide a collector current under quiescent conditions to a first and a second current source;
    a resistor to produce a resistor voltage in response to receiving a portion of one of the collector currents; and
    an output bipolar transistor to provide a quiescent current having a value calculated as a function of the resistor voltage and a base-emitter voltage of said second transistor.

12. The circuit of claim 11, further comprising a second resistor to produce a second resistor voltage in response to receiving the collector current of said first bipolar transistor.

13. The circuit of claim 11, wherein said first and said second bipolar transistors include respective bases, collectors, and emitters, with the bases of said first and said second transistors connected together and the emitters of said first and said second transistors connected to a supply voltage rail.

14. The circuit of claim 11, wherein said resistor is connected to one of the collectors of said first and said second bipolar transistors and the collectors and the bases of said first and said second bipolar transistors.

15. The circuit of claim 11, wherein the first and the second current sources demand an equal amount of current from said first and said second bipolar transistors.

16. The circuit of claim 11, wherein the first and the second current sources demand different amounts of current from said first and said second bipolar transistors.

17. The circuit of claim 11, wherein the respective emitters of said first and said second bipolar transistors are of different areas.

18. The circuit of claim 17, wherein said first and said second bipolar transistors provide differing amounts of the collector currents.

19. The circuit of claim 18, wherein the portion of the one of the collector currents received by said resistor is the difference between the differing amounts of collector currents provided by said first and said second bipolar transistors.

20. The circuit of claim 11, wherein the quiescent current of said output transistor is calculated as a function of the difference of the base-emitter voltage of said first transistor and the resistor voltage.

21. The circuit of claim 12, wherein the quiescent current of said output transistor is calculated as a function of the difference of the base-emitter voltage of said first transistor and the resistor and the second voltages.

22. A circuit, comprising:

first and second amplifier means to each provide a current under quiescent conditions to a first and a second current source;

resistive means to produce a voltage in response to receiving a portion of one of the currents; and output amplifier means to provide a quiescent current as a function of a base-emitter voltage of said second amplifier means and the voltage.

* * * * *